United States Patent [19]
Armezzani et al.

[11] Patent Number: 5,884,397
[45] Date of Patent: Mar. 23, 1999

[54] METHOD FOR FABRICATING CHIP CARRIERS AND PRINTED CIRCUIT BOARDS

[75] Inventors: Gregg Joseph Armezzani, Endwell; Kishor Vithaldas Desai, Vestal; Jeffrey Scott Perkins, Endwell; John James Pessarchick, Binghampton, all of N.Y.

[73] Assignee: International Business Machines Corporation, Armonk, N.Y.

[21] Appl. No.: 692,734

[22] Filed: Aug. 6, 1996

[51] Int. Cl.$^6$ .................................................. H05K 3/34
[52] U.S. Cl. .................................................. 29/840; 29/852
[58] Field of Search ........................... 29/830, 840, 852; 361/760

[56] References Cited

U.S. PATENT DOCUMENTS

| | | |
|---|---|---|
| 558,094 | 11/1896 | Furui et al. ........................... 29/852 X |
| 4,201,616 | 5/1980 | Chellis et al. . |
| 4,780,957 | 11/1988 | Shiga et al. . |
| 4,791,248 | 12/1988 | Oldenettel . |
| 4,806,706 | 2/1989 | Machida et al. . |
| 4,915,795 | 4/1990 | McKiel, Jr. et al. . |
| 4,967,950 | 11/1990 | Legg . |
| 5,159,535 | 10/1992 | Desai et al. . |
| 5,170,931 | 12/1992 | Desai et al. . |
| 5,277,929 | 1/1994 | Seki et al. . |
| 5,374,788 | 12/1994 | Endoh et al. . |
| 5,378,306 | 1/1995 | Gibuldky et al. . |
| 5,418,689 | 5/1995 | Alpaugh et al. . |
| 5,421,083 | 6/1995 | Suppelsa et al. . |
| 5,435,732 | 7/1995 | Angulas et al. . |
| 5,452,178 | 9/1995 | Emesh et al. . |
| 5,634,268 | 6/1997 | Dalal et al. ........................... 29/852 X |
| 5,699,613 | 12/1997 | Chong et al. ........................... 29/852 |

OTHER PUBLICATIONS

IBM Technical Disclosure Bulletin vol. 11, No. 7, Dec. 1968, .Face Protection of Printed Circuit Boards., by McDermott.

*Primary Examiner*—Linda Johnson
*Attorney, Agent, or Firm*—Ratner & Prestia; Arthur J. Samodovitz

[57] ABSTRACT

A method for fabricating a chip carrier and attaching the chip carrier to a printed circuit board is disclosed. A plated through hole (PTH) is formed through a chip carrier substrate. The PTH has surface lands on opposite surfaces of the substrate. Next, at least one of the surfaces of the substrate is covered with a dielectric material. The dielectric material at least partially fills the PTH. A solder ball is attached to the surface land on the opposite side as the dielectric material. Then, a printed circuit board is positioned relative to the chip carrier such that the solder ball contacts a surface land of the printed circuit board. Then, the solder is reflowed. Because the solder is reflowed while the dielectric material at least partially fills the PTH, the dielectric material within the PTH prevents the solder from flowing entirely through the PTH. This prevents contamination of the opposite surface of the chip carrier.

17 Claims, 6 Drawing Sheets

METHOD FOR FABRICATING CHIP CARRIERS AND PRINTED CIRCUIT BOARDS

BACKGROUND OF THE INVENTION

The present invention relates generally to chip carriers and printed circuit boards, and deals more particularly with a method for fabricating chip carriers and printed circuit boards.

Printed circuit boards (PCBs) are well known and comprise multiple layers of dielectric material with metallizations on the layers. The metallizations comprises conductors, power planes, ground planes, internal pads and surface lands. The metallizations are used to connect the components to each other and to I/O pads and provide power and ground. Typically, electronic components are mounted on the exposed surface of at least one of the surface layers. Because the surface layer cannot always accommodate all the requisite conductors, the metallizations on the inner layers are used to provide many of the interconnections. Plated through holes (PTHs) are commonly used to interconnect conductors on different layers. A PTH comprises a metal pad on each of the layers to be interconnected, a hole passing within the metal pads through all the layers, and copper plating on the inner surface of the hole to interconnect the two pads. Pads within the PCB are connected by conductors as required. An electronic component may be soldered to a "surface land" of the final printed circuit board, and the surface land may be connected to an inner layer by a PTH.

A problem with the foregoing technique is that some types of solder and flux, when reflowed i.e. melted, to join the electronic component to the surface land, flow entirely through the PTH and may inadvertently contaminate a layer on the opposite side of the printed circuit board. While there are some solutions to this problem—use of high metal alloy solder balls that do not flow so readily, use of large surface lands which receive solder away from the PTH and use of solid surface lands that cover the PTH, all these solutions significantly add to the cost or size of the resultant product.

A chip carrier may comprise a thin film substrate such as metallized polyimide and be used to mount an integrated circuit for connection to other components and I/O. Metallizations are also provided on both surfaces of the chip carrier, and typically comprise surface lands and conductors. A PTH is also utilized to make an electrical connection between the metallizations on the two surfaces. A chip lead may be soldered to a surface land associated with the PTH or to a conductor leading to the surface land. If the chip lead is soldered directly to the surface land, the same problem may occur in that some types of solder and flux, when reflowed to join the chip lead to the surface land, flow entirely through the PTH and may inadvertently contaminate the metallizations on the opposite surface. While the same types of solutions as described above are possible, they are not cost effective or utilize too much surface area.

The chip carrier may be attached to a printed circuit board as follows. A solder ball is attached to the surface land on the opposite surface as that which mounts the chip. Then, the PCB is positioned beneath the chip carrier such that the solder ball contacts a surface land of the PCB. Then, the solder ball is reflowed to connect the surface land of the chip carrier to the surface land of the PCB. The same problem as described above may occur in that some types of solder and flux, when reflowed to join the surface land of the chip carrier to the surface land of the PCB, flow entirely through the PTH of the PCB and may inadvertently contaminate the metallizations on the opposite surface of the PCB. While the same types of solutions as described above are possible, they are not cost effective or utilize too much surface area.

Accordingly, a general object of the present invention is to provide a cost effective method for soldering electronic components to printed circuit boards and chip carriers with PTHs and soldering chip carriers to PCBs such that solder and flux do not inadvertently flow entirely through any of the associated PTHs.

SUMMARY OF THE INVENTION

The invention resides in a method for fabricating a chip carrier and attaching the chip carrier to a printed circuit board. A plated through hole (PTH) is formed through a chip carrier substrate. The PTH has surface lands on opposite surfaces of the substrate. Next, at least one of the surfaces of the substrate is covered with a dielectric material. The dielectric material at least partially fills the PTH. A solder ball is attached to the surface land on the opposite side as the dielectric material. Then, a printed circuit board is positioned relative to the chip carrier such that the solder ball contacts a surface land of the printed circuit board. Then, the solder is joined to the surface land of the printed circuit board. If the solder is reflowed while the dielectric material at least partially fills the PTH, the dielectric material within the PTH prevents the solder from flowing entirely through the PTH. This prevents contamination of the opposite surface of the chip carrier.

According to one feature of the present invention, the printed circuit board comprises a PTH associated with the surface land of the printed circuit board. The PTH of the printed circuit board is also partially filled with a dielectric material before the solder is reflowed so the solder will not flow entirely through the PTH of the printed circuit board.

DETAILED DESCRIPTION OF THE PREFERRED EMBODIMENTS

Figure 1:
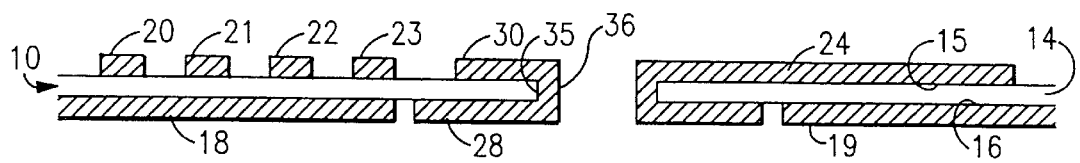
FIG. 1 is a side view of a chip carrier during an early stage in fabrication according to the present invention. However, at this stage, the new steps of present invention have not yet been applied to the chip carrier.

Referring now to the drawings in detail wherein like reference numbers indicate like elements throughout, FIGS. 1–7 illustrate steps in a method according to the present invention for fabricating a chip carrier generally designated 10 and later soldering the chip carrier to a printed circuit board generally designated 11. To begin the method as illustrated in FIG. 1, a thin film substrate 14 is metalized on both surfaces 15 and 16. By way of example, substrate 14 is 0.002" thick and comprises a thin film dielectric such as polyimide. Also, the metallizations are performed by photolithography. The metallizations comprise conductors 18–24 and surface lands 28 and 30. Conductor 24 is connected to surface land 30. Next, a hole 35 is drilled, punched or etched in the middle of the pads 28 and 30 and through substrate 14. Then, the inner surface of the hole 35 is electroplated with copper to yield PTH 36 which interconnects surface lands 28 and 30 to each other. The foregoing steps are all known in the art and are further described in U.S. Pat. Nos. 5,378,306, 4,201,616 and 5,374,788, which patents are hereby incorporated by reference as part of the present disclosure.

Figure 2:
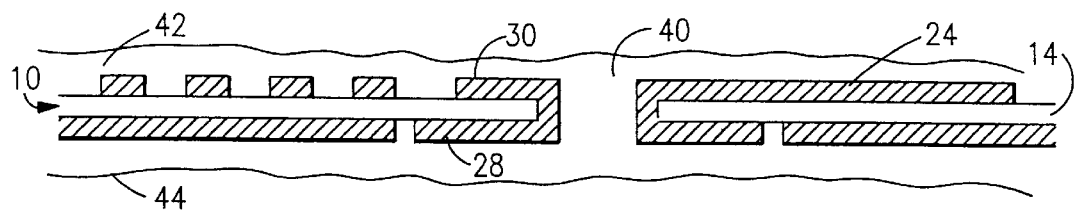
FIG. 2 is a side view of the chip carrier of FIG. 1 after a later stage in fabrication. This subsequent stage begins the new steps of the present invention.

Next as illustrated in FIG. 2, according to the present invention, a photoimageable dry film solder mask/dielectric material 40 such as IBM ASM (tm) material or E. I. du Pont deNemours Vacrel (tm) material is vacuum laminated to both surfaces 15 and 16 of the chip carrier. For example, the lamination process is carried out at 90 degrees C with two millibars of vacuum. During this process, the dielectric material 40 also flows into and fills PTH 36. Next, the chip carrier is cooled and the dielectric material 40 solidifies forming layers 42 and 44 and filling PTH 36.

Figure 3:
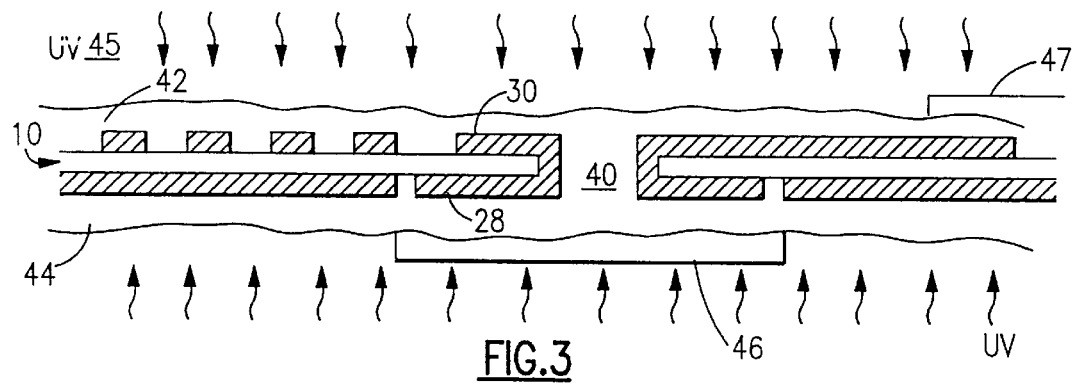
FIG. 3 is a side view of the chip carrier of FIG. 2 after a still later stage in fabrication.
Figure 4:
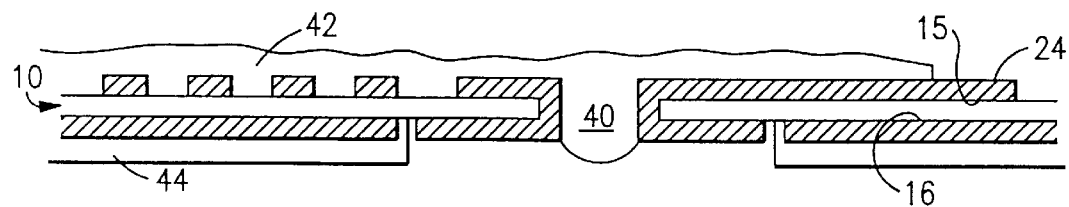
FIG. 4 is a side view of the chip carrier of FIG. 3 after a still later stage in fabrication.

Next, as illustrated in FIG. 3, the area around surface land 28 on layer 44 and around a central part of layer 42 are masked with a film image. Then, the exposed dielectric material of layers 42 and 44 is illuminated by high energy, columnated UV light 45 to cure the dielectric material (by "cross-linking") except for the dielectric material under masks 46 and 47. After the illumination by UV light, both layers 42 and 44 of dielectric material 40 are cured except for the dielectric material under masks 46 and 47. Next, the masks and uncured dielectric material are removed ("developed") by cupric chloride (for ASM material) or sodium carbonate solution (for Vacrel material). The result is illustrated in FIG. 4. Except for the area around surface land 28 on surface 16 and the central area on surface 15, both sides of the chip carrier 10 are covered by layers 42 and 44 of the dielectric material 40. Moreover, PTH 36 is filled with the dielectric material 40.

Figure 5:
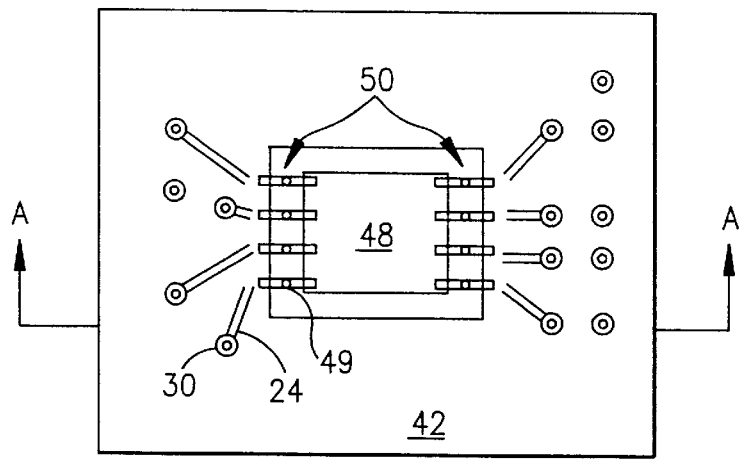
FIG. 5 is a top view of the chip carrier of FIG. 4 with a chip attached to the chip carrier according to a still later stage in fabrication.

Next, as illustrated in FIG. 5, a chip 48 is soldered to conductors on surface 15 in the center area void of dielectric layer 42 by a ball grid array 50. By way of example, each of the solder balls in ball grid array 50 including solder ball 49 comprises 97% lead 3% tin. Alternately, the chip can be bonded by gold/gold diffusion to the chip carrier. The use of a ball grid array to solder a chip to a prior art chip carrier such as illustrated in FIG. 1 is further described in U.S. Pat. No. 4,967,950, which patent is hereby incorporated by reference as part of the present disclosure. The same type of ball grid array process is used in the present invention.

Figure 6:
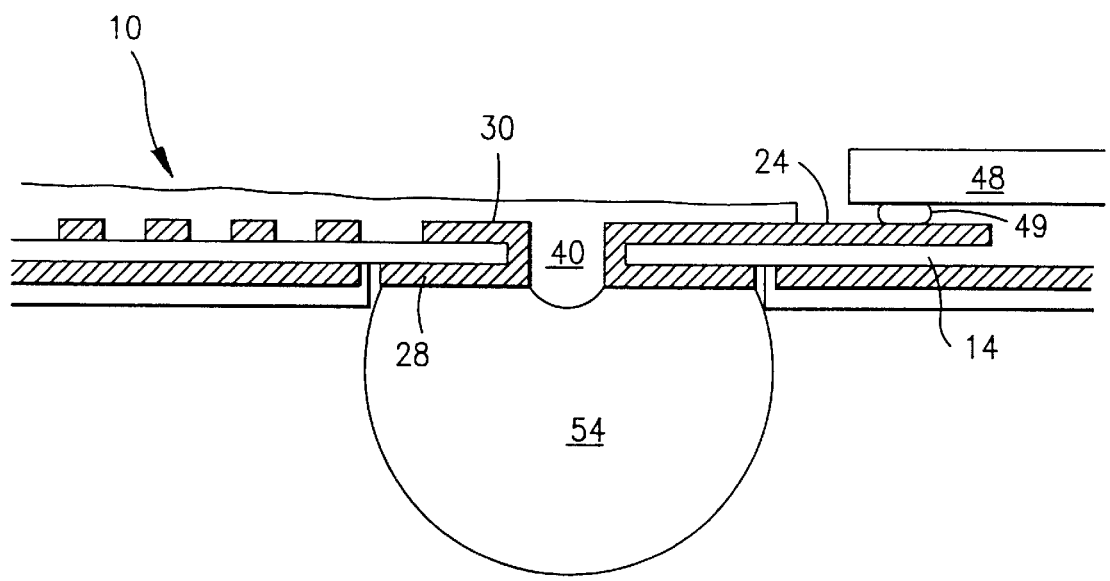
FIG. 6 is a side view of FIG. 5 along the plane A—A with a solder ball attached to the chip carrier.

Next, as illustrated in FIG. 6, a solder ball 54 is reflowed to attach to surface land 28. By way of example, solder ball 54 comprises 63% lead 37% tin.

Figure 7:
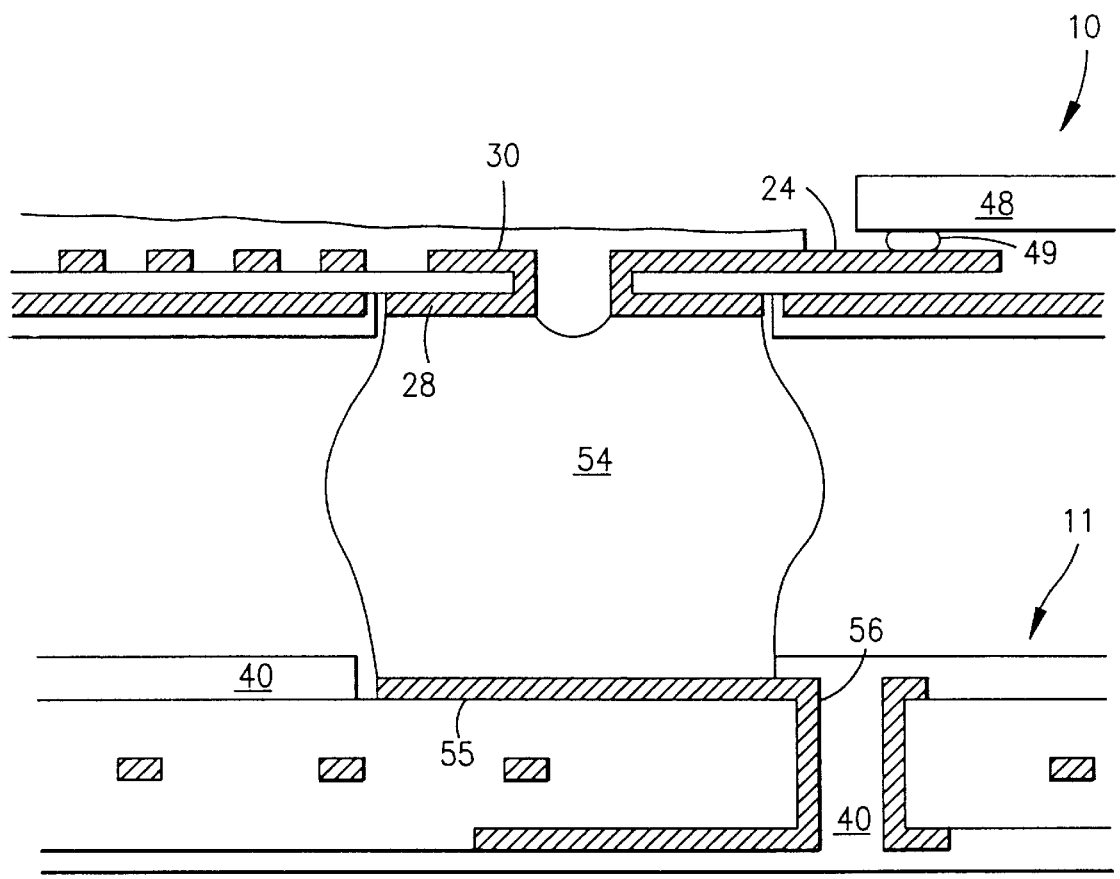
FIG. 7 is a side view of the chip carrier and chip of FIG. 6 and a printed circuit board attached to the chip carrier according to a still later stage in fabrication.

Next, as illustrated in FIG. 7, printed circuit board 11 is positioned beneath chip carrier 10 such that solder ball 54 contacts a surface land 55 or a PTH 56 of PCB 11. Both surfaces of PCB 11 are covered with dielectric material 40 except for an area over surface land 55 under the solder balls. These layers of dielectric material on the surfaces of PCB 11 were formed in the same manner as described above for layers 42 and 44. PTH 56 is also filled with dielectric material 40. Although not shown, other solder balls are likewise positioned over respective, exposed surface lands. Then, the solder ball 54 is reflowed at 220 degrees C. Alternately, the solder ball 54 can be joined to the PTH 56 in PCB 11 by conductive adhesive, solder paste, dendrites, sockets, or other mechanical means. The solder and associated flux cannot flow entirely through PTH 36 in chip carrier 10 or PTH 56 in PCB 11 because of the presence of the dielectric material 40 in PTH 36 and PTH 56. Thus, there is no inadvertent contamination of chip carrier 10 or PCB 11.

Figure 8:
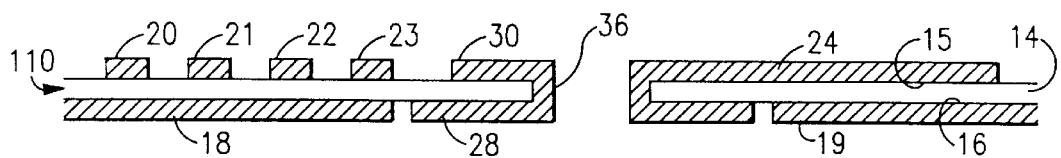
FIG. 8 is a side view of a chip carrier during an early stage in fabrication according to another embodiment of the present invention. However, at this stage, the new steps of the present invention have not yet been applied to the chip carrier.
Figure 9:
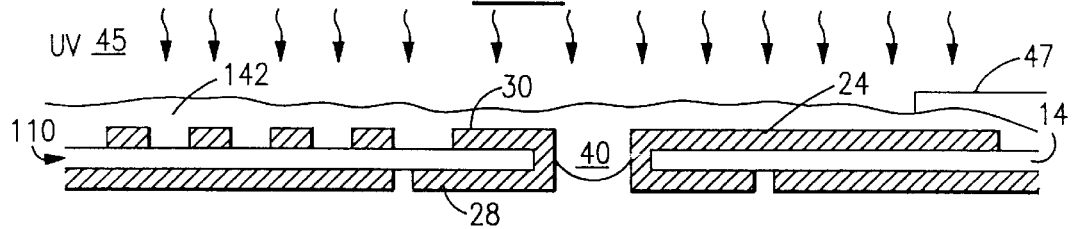
FIG. 9 is a side view of the chip carrier of FIG. 8 after a later stage in fabrication. This subsequent stage begins the new steps of the present invention.
Figure 10:
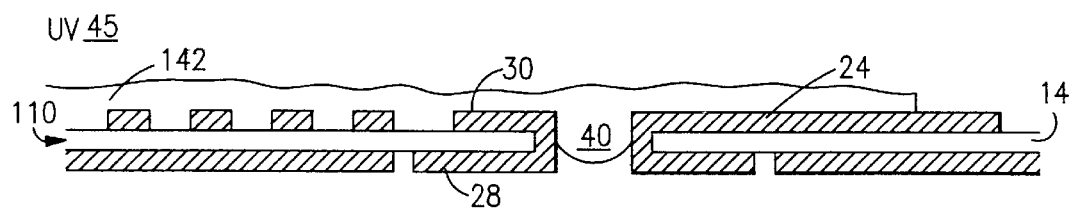
FIG. 10 is a side view of the chip carrier of FIG. 9 after a still later stage in fabrication.

FIGS. 8–15 illustrate another method according to the present invention for fabricating a chip carrier 110. As illustrated in FIG. 8, the method of FIGS. 8–14 begins with the formation of the metalized substrate and PTH 36 as described above and illustrated in FIG. 1. Then, according to the present invention, the photoimageable dry film solder mask/dielectric material 40 is vacuum laminated to surface 15 of substrate 14. For example, the lamination process is carried out at 90 degrees C with 2 millibars of vacuum. During this process, the dielectric material 40 flows into PTH 36 and fills the PTH approximately ⅔ the way as illustrated in FIG. 9. Next, chip carrier 110 is cooled and the dielectric material 40 solidifies to form layer 142. Next, a central area of layer 142 is masked. Then, dielectric material 40 on surface 15 is illuminated by high energy, columnated UV light 45 to cure all the dielectric material including the dielectric material 40 in the PTH 36 (by "cross-linking") except for the central area. Next, mask 47 and uncured dielectric material are removed by cupric chloride or sodium carbonate. The result is illustrated in FIG. 10.

Figure 11:
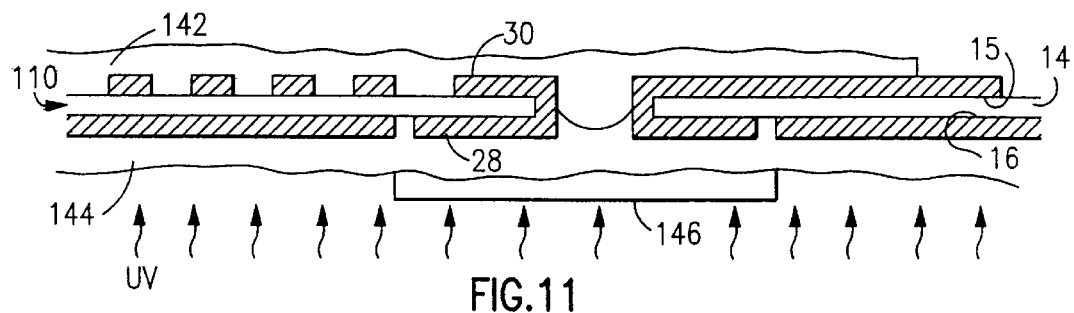
FIG. 11 is a side view of the chip carrier of FIG. 10 after a still later stage in fabrication.

Next, additional dielectric material 40 is applied to surface 16 and cooled to harden the dielectric material and form layer 144 as illustrated in FIG. 11. Next, the area around surface land 28 is masked. Then, the exposed dielectric material 40 on surface 16 is illuminated by high energy, columnated UV light to cure the dielectric material (by "cross-linking") except for the dielectric material 40 under mask 146. After the illumination by UV light, all the dielectric material 40 on surface 16 is cured except for the dielectric material under mask 146 around surface land 28.

Figure 12:
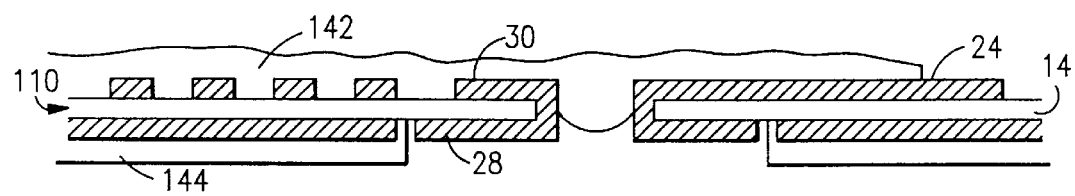
FIG. 12 is a side view of the chip carrier of FIG. 11 after a still later stage in fabrication.

Next, the mask and uncured dielectric material are removed by cupric chloride or sodium carbonate. The result is illustrated in FIG. 12. Except for an area around surface land 28 on surface 16 and the central area on surface 15, both sides of the chip carrier 110 are now covered by the dielectric material 40 and the dielectric material 40 fills ⅔ of PTH 36.

Figure 13:
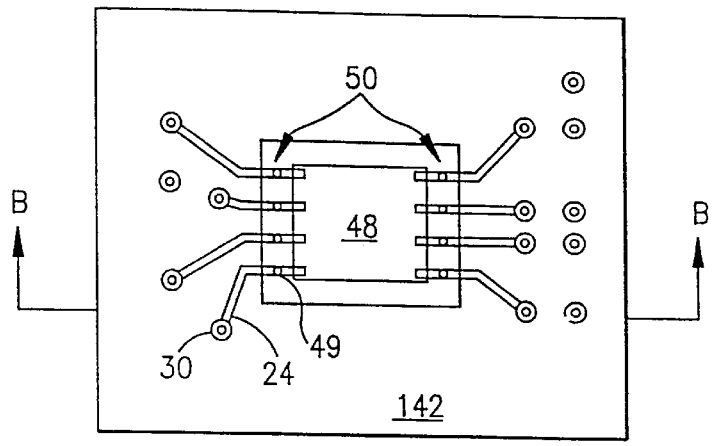
FIG. 13 is a top view of the chip carrier of FIG. 12 with a chip attached to the chip carrier after a still later stage in fabrication.

Next, as illustrated in FIG. 13, chip 48 is soldered to conductors on surface 15 in the center area void of dielectric layer 142 by a ball grid array 50. By way of example, each of the solder balls in ball grid array 50 including solder ball 49 comprises 97% lead 3% tin. Alternately, the chip is bonded to the chip carrier by gold/gold diffusion.

Figure 14:
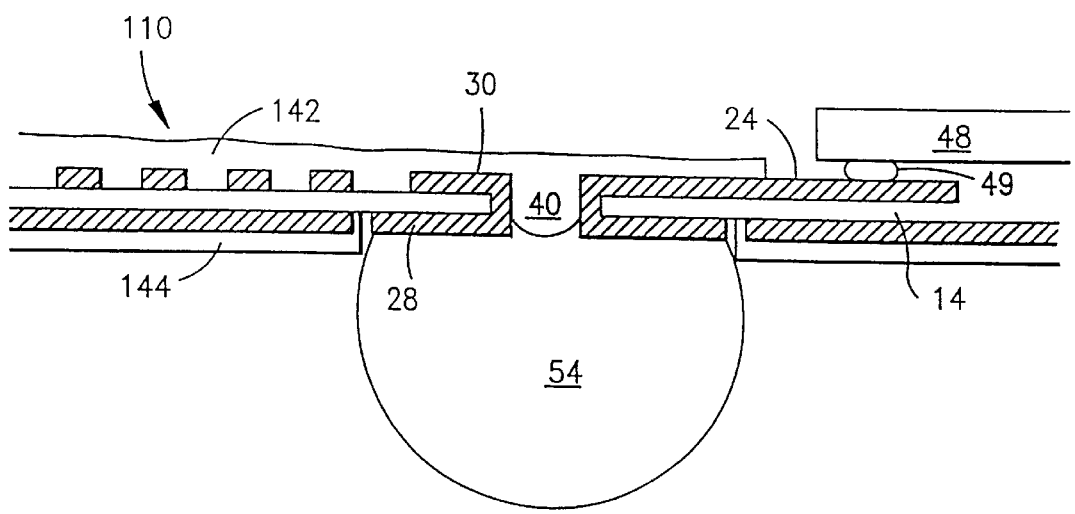
FIG. 14 is a side view of FIG. 13 along the plane B—B with a solder ball attached to the chip carrier.

Next, as illustrated in FIG. 14, a solder ball 54 is reflowed to attach to surface land 28. By way of example, solder ball 54 comprises 63% lead 37% tin.

Figure 15:
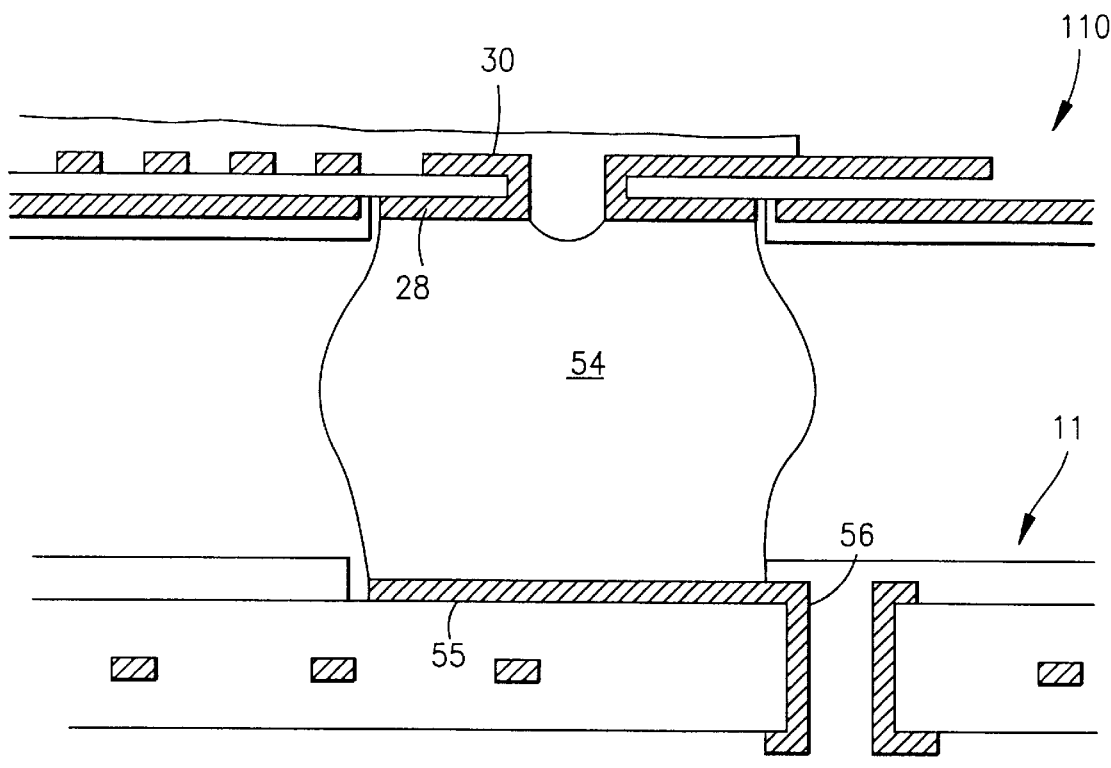
FIG. 15 is a side view of the chip carrier and chip of FIG. 14 and a printed circuit board attached to the chip carrier after a still later stage in fabrication.

Next, as illustrated in FIG. 15, printed circuit board 11 is positioned beneath chip carrier 110 such that solder ball 54 contacts surface land 55 of PTH 56 of PCB 11. Both surfaces of PCB 11 are covered with dielectric material 40 except for an area under the solder balls. These layers of dielectric material on the surfaces of PCB 11 were formed in the same manner as described above for layers 142 and 144. PTH 56 is also filled with dielectric material 40. Although not shown, the other solder balls are likewise positioned over respective surface lands. Then, the solder ball 54 is reflowed at 220 degrees C. The solder and associated flux cannot flow entirely through PTH 36 in chip carrier 110 or PTH 56 in PCB 11 because of the presence of the dielectric material 40 in PTH 36 and PTH 56.

Figure 16:
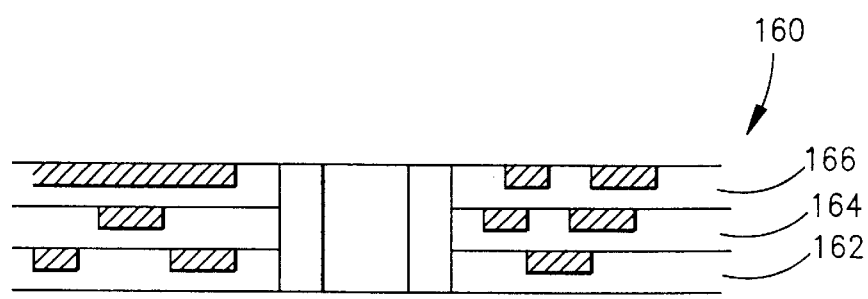
FIG. 16 is a side view of a printed circuit board which can substitute for a substrate layer 14 within FIGS. 1–15 to form a printed circuit board according to both embodiments of the present invention.

FIG. 16 illustrates three layers of a printed circuit board generally designated 160 which can substitute for substrate 14 in FIGS. 1–15 to yield a printed circuit board with the dielectric filled PTH according to the present invention. PCB layers 160 are formed by starting with dielectric layer 162, metallizing layer 162, laminating dielectric layer 164 onto layer 162, metallizing layer 164, laminating dielectric layer 166 on layer 164 and metallizing layer 166. These laminations and metallizations are performed by known processes. For example, the dielectric layers comprise epoxy glass and are laminated at 500–700 psi and 185 degrees C for two hours. The metallizations are performed by electroplating.

Based on the foregoing, methods for fabricating printed circuit boards according to the present invention have been disclosed. However, numerous modifications and substitutions can be made without deviating from the scope of the present invention. For example, other types of printed circuit boards can be used such as E.I. du Pont deNemours Teflon (tm) or polyimide. Also, the present invention can be used to interconnect a component lead on a surface land 28 of a PTH. Also, the present invention is applicable for other types of carrier substrates such as laminate expoxy resin, Teflon, ceramic and silicon. Therefore, the present invention has been disclosed by way of illustration and not limitation and reference should be made to the following claims to determine the scope of the present invention.

We claim:

1. A method for fabricating a chip carrier, said method comprising the steps of:

forming a plated through hole (PTH) through a substrate having a first surface and an opposite second surface, said PTH having coincident surface lands on said opposite first and second surfaces of said substrate;

covering at least said first surface of said substrate with a dry film dielectric material, said dielectric material at least partially filling said PTH;

assuring removal of any dielectric material from said second surface of said substrate in the area of said PTH and said surface land; and while said dielectric material at least partially fills said PTH, reflowing solder at said surface land which is on said second surface of said substrate, said dielectric material within said PTH preventing said solder from flowing entirely through said PTH.

2. A method as set forth in claim 1 wherein the reflowing step comprises the steps of:

attaching a solder ball to said one surface land;

positioning a printed circuit board relative to said chip carrier such that said solder ball contacts a surface land of said printed circuit board; and reflowing said solder after said positioning step.

3. A method as set forth in claim 2 wherein said printed circuit board comprises a PTH associated with said surface land of said printed circuit board, and further comprising the step of at least partially filling said PTH of said printed circuit board with a dielectric material before performing said attaching, position and reflowing said solder steps.

4. A method as set forth in claim 1 wherein the step of covering said other surface with a dielectric material is performed concurrently with the step of covering said one surface with a dielectric material.

5. A method as set forth in claim 1 wherein the step of covering said other surface with a dielectric material is performed after the step of covering said one surface with a dielectric material.

6. A method as set forth in claim 1 wherein said dielectric material does not completely fill said PTH.

7. A method as set forth in claim 1 wherein said dielectric material comprises a photoimageable material.

8. A method as set forth in claim 1 wherein said substrate comprises a thin film dielectric material.

9. A method as set forth in claim 1 further comprising the steps of:

positioning a printed circuit board relative to said chip carrier such that said solder contacts or is adjacent to a surface land of said printed circuit board; and joining said solder to said surface land of said printed circuit board after said positioning step.

10. A method as set forth in claim 1 wherein said substrate comprises two or more metallized dielectric layers.

11. A method for fabricating a printed circuit board, said method comprising the steps of:

forming together one or more layers of a printed circuit board (PCB);

forming a plated through hole (PTH) through said layer (s), said PTH having at least one coincident surface land;

covering a surface of said PCB opposite said surface having said surface land with a dry film dielectric material, said dielectric material at least partially filling said PTH;

assuring removal of any dielectric material from said surface of said PCB in the area of said PTH and said surface land; and while said dielectric material at least partially fills said PTH, reflowing solder at said surface land, said dielectric material within said PTH preventing said solder from flowing entirely through said PTH.

12. A method as set forth in claim 11 further comprising the steps of:

before the reflowing step, covering said other surface of said PCB with a dielectric material except for a region around said one surface land.

13. A method as set forth in claim 12 wherein the step of covering said other surface with a dielectric material is performed concurrently with the step of covering said one surface with a dielectric material.

14. A method as set forth in claim 12 wherein the step of covering said other surface with a dielectric material is performed after the step of covering said one surface with a dielectric material.

15. A method as set forth in claim 12 wherein the step of covering said other surface of said PCB with a dielectric material except for a region around said one surface land is performed by first covering said other surface of said PCB including said region with said dielectric material and then removing the dielectric material in said region.

16. A method as set forth in claim 11 wherein said dielectric material does not completely fill said PTH.

17. A method as set forth in claim 11 wherein said dielectric material comprises a photoimageable material.

\* \* \* \* \*